US009589873B2

(12) United States Patent
Tollafield (10) Patent No.: US 9,589,873 B2
(45) Date of Patent: Mar. 7, 2017

(54) LEADLESS CHIP CARRIER

(71) Applicant: MICROSS COMPONENTS LIMITED, Norwich (GB)

(72) Inventor: Peter Julian Tollafield, Marbury (GB)

(73) Assignee: MICROSS COMPONENTS LIMITED, Norwich (GB)

( * ) Notice: Subject to any disclaimer, the term of this patent is extended or adjusted under 35 U.S.C. 154(b) by 0 days.

(21) Appl. No.: 14/664,515

(22) Filed: Mar. 20, 2015

(65) Prior Publication Data

US 2015/0270205 A1    Sep. 24, 2015

(30) Foreign Application Priority Data

Mar. 20, 2014  (GB) .................................. 1405026.4

(51) Int. Cl.
| | |
|---|---|
| H01L 23/495 | (2006.01) |
| B23K 1/00 | (2006.01) |
| H01L 21/48 | (2006.01) |
| H01L 23/31 | (2006.01) |
| H05K 1/02 | (2006.01) |

(52) U.S. Cl.
CPC ...... *H01L 23/49568* (2013.01); *B23K 1/0016* (2013.01); *H01L 21/4825* (2013.01); *H01L 23/49503* (2013.01); *H01L 23/49517* (2013.01); *H01L 23/49541* (2013.01); *H01L 23/3107* (2013.01); *H01L 2224/48091* (2013.01); *H01L 2224/48247* (2013.01); *H01L 2924/15311* (2013.01); *H05K 1/0209* (2013.01); *H05K 2201/066* (2013.01); *H05K 2201/10727* (2013.01)

(58) Field of Classification Search
CPC ................. H01L 23/503; H01L 23/517; H01L 23/49568; H01L 23/49503; H01L 23/49517
USPC .................. 257/675, 666, E23.031, E23.051
See application file for complete search history.

(56) References Cited

U.S. PATENT DOCUMENTS

| | | |
|---|---|---|
| 4,554,575 A | 11/1985 | Lucas |
| 4,963,002 A | 10/1990 | Tagusa et al. |
| 5,147,084 A | 9/1992 | Behun et al. |

(Continued)

FOREIGN PATENT DOCUMENTS

| | | |
|---|---|---|
| EP | 0690500 A1 | 1/1996 |
| EP | 1073322 A1 | 1/2001 |

OTHER PUBLICATIONS

Search Report from GB Application No. GB1405026.4, United Kingdom Intellectual Property Office, Aug. 27, 2015, 4 pages.

(Continued)

*Primary Examiner* — Nitin Parekh
(74) *Attorney, Agent, or Firm* — Silicon Valley Patent Group LLP (57) ABSTRACT

A leadless chip carrier comprises a thermal pad for attaching to a printed circuit board (PCB) and an integrated circuit electrically connected to a plurality of electrical lead frame pads for connection to a plurality of corresponding pads on the PCB. The leadless chip carrier further comprises a non-collapsible conductive shim bonded to a first surface of the thermal pad and each of the plurality of electrical lead frame pads is attached to a volume of solder. The conductive shim provides a stand-off between the thermal pad and the PCB and improves the integrity of a joint between the thermal pad and the PCB.

12 Claims, 6 Drawing Sheets

(56) References Cited

U.S. PATENT DOCUMENTS

| | | | |
|---|---|---|---|
| 5,929,521 A | 7/1999 | Wark et al. | |
| 5,931,371 A | 8/1999 | Pao et al. | |
| 6,087,597 A | 7/2000 | Shimada et al. | |
| 6,215,179 B1* | 4/2001 | Ohgiyama | H01L 21/561 257/676 |
| 6,472,611 B1 | 10/2002 | Dunford | |
| 6,548,328 B1* | 4/2003 | Sakamoto | H01L 21/4821 257/666 |
| 6,802,119 B2 | 10/2004 | Dunford | |
| 6,965,157 B1* | 11/2005 | Perez | H01L 21/4842 257/666 |
| 7,245,007 B1* | 7/2007 | Foster | H01L 23/49527 257/666 |
| 8,063,470 B1* | 11/2011 | Sirinorakul | H01L 21/4832 257/666 |
| 8,120,152 B2* | 2/2012 | Chang Chien | H01L 21/4832 257/666 |
| 8,319,323 B2 | 11/2012 | Letterman, Jr. et al. | |
| 8,330,270 B1* | 12/2012 | Lin | H01L 21/4828 257/666 |
| 8,890,310 B2* | 11/2014 | Lee | H01L 23/4334 257/666 |
| 2003/0008434 A1 | 1/2003 | Dunford | |
| 2003/0178708 A1* | 9/2003 | Minamio | H01L 21/4842 257/666 |
| 2008/0029860 A1* | 2/2008 | Gao | H01L 23/49575 257/675 |
| 2008/0211068 A1* | 9/2008 | Chen | H01L 23/3107 257/666 |
| 2009/0051004 A1 | 2/2009 | Roth et al. | |
| 2009/0284932 A1* | 11/2009 | Lin | H01L 23/4334 361/718 |
| 2010/0008305 A1* | 1/2010 | Yeo | H04W 72/1252 370/329 |
| 2010/0084756 A1* | 4/2010 | Dirks | H01L 23/3114 257/690 |
| 2011/0111562 A1* | 5/2011 | San Antonio | H01L 21/4832 438/113 |
| 2011/0163430 A1* | 7/2011 | Lee | H01L 21/4832 257/676 |

OTHER PUBLICATIONS

Kim et al., "Improved Reliability of Copper-Cored Solder Joints Under a Harsh Thermal Cycling Condition", Microelectronics Reliability 2012, vol. 52, pp. 1441-1444.

Fujiwara et al., "Electromigration in Copper-Core Solder Ball Joints During Thermal Cycle Tests", ASME 2011 Pacific Rim Technical Conference, Portland Oregon, USA Jul. 6-8, 2011, ISBN:978-0-7918-4462-5.

Kim et al., "Fracture Behavior of Cu-cored Solder Joints", J Mater Sci (2011) vol. 46, pp. 6897-6903.

Kong et al., "The Reliability Challenges of QFN Packaging", DfR Solutions, College Park, Maryland, USA, pp. 1-3.

Quek, "QFN Layout Guidelines", Texas Instruments, Application Report, SLOA122-Jul. 2006, HPL Audio Power Amplifiers, pp. 1-7.

"Cu Cored Balls, Copper Balls", Senju Metal Industry Co., Ltd., ECO Solder Ball, Tokyo, Japan, p. 1.

European Search Report, EP Application No. 15159491.8, The Hague, Oct. 23, 2015, pp. 1-10.

* cited by examiner

LEADLESS CHIP CARRIER

CROSS-REFERENCE TO RELATED APPLICATION(S)

This application claims the benefit of and priority to United Kingdom Application No. 1405026.4 filed on Mar. 20, 2014, which is incorporated herein by reference in its entirety.

FIELD

The invention relates to a leadless chip carrier for attachment to a printed circuit board (PCB), the leadless chip carrier providing improved reliability. The invention also relates to a method of modifying a leadless chip carrier to form a leadless chip carrier having improved reliability.

BACKGROUND

A chip carrier is a semiconductor package that allows an integrated circuit to be mounted onto a PCB. A typical chip carrier comprises one or more integrated circuits mounted on a leadframe and encapsulated in a casing, for example a ceramic casing or a resin casing. Many chip carriers are leaded chip carriers having connection leads extending from the casing for attaching the chip carrier to a PCB and for making connections between an integrated circuit and the PCB. Some chip carriers are leadless chip carriers having exposed lead frame pads mounted within the casing for making connections to a PCB.

Heat generated by integrated circuits may need to be removed in order to maintain operation. Thus, these integrated circuits within a chip carrier are typically mounted on a die pad or heat sink. In some chip carriers the heat sink is exposed through a surface of the package casing to be attached to a PCB. A die pad may alternatively, or additionally, act as an electrical grounding for the integrated circuit.

At present a large proportion of chip carriers are leaded chip carriers. One disadvantage of using leaded chip carriers is that the leads of the chip carrier may bend easily and, therefore, careful handling of the leaded chip carriers is required. Any leads that are misaligned will not be able to connect to corresponding connections on a PCB. To this end, leaded chip carriers require special handling trays to avoid bent or damaged connection leads. Lead inductance may also be undesirable, and the leads contribute to the weight of the chip carrier package.

Some problems associated with leaded chip carriers may be solved by use of a leadless chip carrier. The lead frame pads of a leadless chip carrier do not extend beyond the surface of the package casing that they are encapsulated within and, thus, leadless chip carriers may be handled robustly without damage to the lead frame pads. Leadless chip carriers may be coupled directly to a PCB by means of low profile solder joints. No special handling is required to avoid damaging the package and it is easier to correctly align a leadless chip carrier onto a PCB than it is to align a leaded chip carrier. Furthermore, leadless chip carrier packages such as a quad flat no-leads (QFN) package may provide a small sized "near chip scale" footprint, a thin profile and a low weight, as well as good thermal and electrical performance. Such properties make leadless chip carriers an advantageous choice for applications where size, weight, and thermal and electrical performance are important.

Despite the advantages associated with leadless chip carriers the nature of the leadless construction presents some reliability issues. The lead frame pads of a leadless chip carrier are set within the package casing and, effectively, are inflexible. Leadless chip carriers are generally attached to a PCB by means of a low profile solder joint. A typical solder joint height would be in the range from 50 to 75 micrometers. Certain packages can be bonded with a solder joint as little as 30 micrometers in height. Because there are no flexible leads to accommodate stresses and strains, leadless chip carriers provide very little compliance during thermal cycling, thermal shock, physical shock, and vibration. Effectively, all stresses and strains need to be accommodated within the thin solder joint. The stresses within a solder joint increase with any mismatch in the coefficient of thermal expansion between the solder and the lead frame of the chip carrier and the PCB. Joint stresses also increase with increases in package size. For some packages the joint lifetime may be as low as a few hundred temperature cycles.

In addition to joint reliability issues, leadless chip carriers may also provide a number of assembly issues. Difficulties in applying the correct amount of solder may result in the chip carrier tipping, floating or in defects forming in the joint between the chip carrier and the PCB, such as excess voidage.

It is an aim of the present application to provide an improved leadless chip carrier having an improved joint reliability.

SUMMARY

The invention provides a leadless chip carrier and a method of modifying a leadless chip carrier as defined in the appended independent claims, to which reference should now be made. Preferred and advantageous features of the invention are set out in various dependent subclaims.

Thus, a leadless chip carrier may comprise a thermal pad, and may be suitable for attachment to a printed circuit board (PCB). The leadless chip carrier may alternatively be termed a bottom termination component (BTC). The leadless chip carrier may further comprise an integrated circuit electrically connected to a plurality of electrical lead frame pads. The plurality of lead frame pads allow electrical connection between the integrated circuit and a plurality of corresponding pads on the PCB. The leadless chip carrier further comprises a non-collapsible conductive shim bonded to a first surface of the thermal pad. The term non-collapsible means that the conductive shim does not flow or deform at the temperature of bonding to the PCB nor at temperatures experienced by the chip carrier during operation.

The conductive shim is between 50 microns and 1000 microns in thickness, preferably between 100 microns and 500 microns in thickness, for providing a stand-off between the thermal pad and the PCB. Additionally, each of the plurality of electrical lead frame pads is coupled to or attached to a volume of solder. Components of the leadless chip carrier are located by, or encapsulated within a casing, which may be termed a package casing.

Thus, the leadless chip carrier is a discrete component that comprises the conductive shim, which is bonded to the thermal pad. The leadless chip carrier also comprises the volume of solder coupled to each lead frame pad. The leadless chip carrier is a discrete component that may be subsequently attached to a PCB via the conductive shim and the thermal pad and via the volumes of solder.

The non-collapsible conductive shim may comprise a substantially planar section of conductive metal, carbon, or ceramic bonded to a first surface of the thermal pad, for example a portion of a metallic sheet or foil. The non-collapsible conductive shim may have through holes defined through the thickness of the shim. Any through holes are preferably filled with solder during or after bonding of the shim to the thermal pad.

The non-collapsible conductive shim may be formed by a substantially planar mesh bonded to a first surface of the thermal pad, for example a carbon, ceramic, or metallic mesh. Holes defined through the mesh are preferably filled with solder during or after bonding of the shim to the thermal pad.

The casing may be a plastic casing, for example a resin casing, or the casing may be ceramic. At least a surface of the thermal pad and at least a surface of the plurality of electrical lead frame pads are exposed through a surface of the package casing.

The conductive shim provides a stand-off, which is an increased effective joint thickness, between the thermal pad of the leadless chip carrier and the PCB. This increased joint thickness, and the fact that there are bonds between the thermal pad and the conductive shim and between the conductive shim and the PCB, allows the joint to accommodate a greater amount of strain. This may significantly increase the stress magnitude and number of thermal or mechanical cycles that the joint can withstand without failure.

It is known that an increased joint thickness between a leadless chip carrier and a PCB increases the number of thermal cycles that the joint can withstand. Typically, a stand-off between a chip carrier and a PCB is provided by means of an increased solder thickness within a joint. Thus, during assembly, solder Paste, solder balls or solder preforms may be located between the thermal pad of a leadless chip carrier and a PCB in order to provide a desired stand-off. This prior art solution to the joint reliability problem presents a number of issues. One issue is that it is difficult to control the thickness of the stand-off when the stand-off is defined by a volume of solder. When solder reflows during joining it is difficult to provide a precise gap between the thermal pad and the PCB. A further problem with providing a stand-off by means of increasing thickness of solder is that the leadless chip carrier may tip when mounted to the PCB. Such tipping may cause asymmetrical thermal and electrical performance and difficulties in providing accurate and reliable connections on some or all of the pads.

A further problem associated with providing a stand-off by means of increased solder thickness during assembly is that it is very easy to form defects, such as voidage between the thermal pad and the PCB. Excessive voidage can reduce the effectiveness of heat being removed from the leadless chip carrier and compromise electrical path via the thermal pad to the PCB resulting in a loss of performance of the component.

A leadless chip carrier having a non-collapsible conductive shim bonded to its exposed thermal pad significantly reduces these known problems. As the conductive shim is non-collapsible, a very precise and predeterminable stand-off distance may be achieved. Furthermore, the non-collapsible nature of the conductive shim ensures that tipping of the component is reduced significantly. Thus, all of the electrical lead frame pads may be maintained at the desired predetermined distance from the PCB for providing a quality and reliable solder joint.

As used herein, the term thermal pad refers to an exposed pad that may be used to couple or attach the leadless chip carrier to a PCB. The thermal pad is preferably in electrical and/or thermal communication with the integrated circuit. The integrated circuit may be mounted on an internal surface of the thermal pad, which may be referred to as a die pad. In some embodiments the thermal pad may act to electrically ground the integrated circuit and may be referred to as a ground plane. In some embodiments the thermal pad may act to transfer thermal energy away from the integrated circuit and may be referred to as a heat sink. The thermal pad may simultaneously act as a ground plane and a heat sink.

As used herein a PCB is a component that mechanically supports and electrically connects electronic components. The term PCB is used generically herein to encompass all such components onto which a leadless chip carrier may be mounted, including printed wiring boards (PWBs), printed circuit assemblies (PCAs), circuit cards, or circuit card assemblies (CCAs).

Preferably the conductive shim covers at least 80% of the surface of the thermal pad, preferably at least 90%, preferably at least 95% of the surface of the thermal pad. Particularly preferably the conductive shim covers substantially all of the area of the heat sink.

An additional advantage of providing a leadless chip carrier having a non-collapsible conductive shim bonded to a thermal pad is that the bond between the conductive shim and the thermal pad can be made in a controlled environment. Thus, it is preferable that the bond between the conductive shim and the thermal pad has a voidage of less than 30%, preferably less than 10% over the area between the conductive shim and the thermal pad. Preferably this voidage is less than 7.5% or lower than 5%.

Particularly preferably the voidage between the conductive shim and the thermal pad is less than 3% or less than 2% or about 1%.

It is known in the prior art to insert conductive copper preforms into a solder joint during assembly of the joint in order to increase the strength of the joint, and to maintain a particular gap. Whilst it may be possible to improve the thermal cycling resilience of a joint between a leadless chip carrier and a PCB by inserting a conductive preform into the joint during PCB assembly, there are a number of problems associated with this approach. The first problem is that separate handling is required for the conductive preform and the leadless chip carrier. Separate handling adds cost and complexity to the assembly process. The leadless chip carrier will then need to be aligned with both the PCB and the preform to form a joint. Furthermore, as the conductive preform has raised the chip carrier from the PCB, the lead frame pads are raised above their corresponding contact pads on the PCB. Thus, a greater volume of solder needs to be added to the joint to make the contact between the leadframe pads and the PCB. It can be difficult to make these connections reliably during PCB assembly.

The main problem, however, is in the integrity of the joints. In order to insert a preform into a joint to provide a certain stand-off during manufacture a joint needs to be provided between the preform and the PCB and between the thermal pad of the leadless chip carrier and the preform. Both of these joints would be formed during the assembly of components on to the PCB. In some specific applications, it is estimated that there should be no more than 30% voidage in a joint between a leadless chip carrier and a PCB, for example in order to prevent overheating of certain types of chip carrier. In other words, in order for heat to be removed at an adequate rate from these certain types of chip carrier there can be no more than 30% voidage in the joint. It is more challenging to form a single joint between a thermal pad and a printed circuit board during assembly of components onto a PCB in which the joint complies with this voidage requirement. By inserting a preform into the joint, effectively two joints need to be formed during assembly, and the effective voidage of the joint is doubled. By providing a leadless chip carrier in which a non-collapsible conductive shim is pre-bonded to a thermal pad, the joint between the conductive shim and the thermal pad may be made in a controlled environment and the voidage in this joint is preferably very low so that it preferably makes a minimal contribution to the overall voidage of the assembled joint.

It is preferable that the conductive shim is formed from a material with high thermal and electrical conductivity. A preferred material for forming a conductive shim is copper or a copper alloy.

The conductive shim is preferably substantially planar having a first surface, a second surface, and a thickness of between 100 microns and 1000 microns. The thickness may be between, for example 150 microns and 500 microns, between 200 microns and 400 microns. The stand-off between the thermal pad and a PCB is defined by the thickness provided by the non-collapsible conductive shim and the combined thickness of bonds between the conductive shim and the thermal pad and the conductive shim and the PCB.

An advantageous means of bonding the conductive shim to the thermal pad is by use of a solder. Particularly advantageously the conductive shim may be a conductive shim having one or both sides pre-clad with solder of predetermined composition and thickness. The non-collapsible conductive shim may be bonded to the thermal pad by means of a layer of solder paste or Flux, for example a layer of solder having a thickness of between 10 microns and 30 microns. The bond may, alternatively be made by a solder paste of up to 150 microns in thickness. The conductive shim may have a second surface that is coated or clad in a layer of solder of between 10 microns and 30 microns in thickness for facilitating a bond to a PCB.

The conductive shim provides a stand-off between the thermal pad and a PCB. Joints between the electrical lead frame pads of the leadless chip carrier and the PCB must be created over this stand-off distance. To facilitate this, each of the electrical lead frame pads is attached to or coupled to a volume of solder, for example a ball or meniscus of solder of approximately the overall thickness achieved by the shim and the solder used to attach the shim to the thermal pad on the leadless chip carrier, plus or minus 10%.

In particularly preferred embodiments each volume of solder on each of the plurality of peripheral lead frame pads may encapsulate a non-collapsible ball having a diameter of approximately equal to the overall thickness achieved by the shim and the solder used to attach the shim to the thermal pad on the leadless chip carrier, plus or minus 10%. In such embodiments, a stand-off is therefore provided by both the non-collapsible conductive shim and the non-collapsible balls in the peripheral lead frame pads.

As with the conductive shim, it is preferable that the non-collapsible conductive balls are formed from known material that is electrically and thermally conductive. Thus, it is preferred that the balls are conductive balls, for example balls formed from copper or a copper alloy, or balls formed from a high melting point solder, having a melting point higher than the encapsulating volume of solder. The non-collapsible balls may be conductive balls, for example copper balls, coated with, or encapsulated within, a solder layer of between 10 and 30 micrometers.

The encapsulating volume of solder may, however, provide sufficient electrical connection between the electrical lead frame pads and the PCB and, in such circumstances; the non-collapsible ball may be of low conductivity or effectively no conductivity. For example the ball may be a polymer, ceramic, or glass ball.

A leadless chip carrier as described herein may allow for a significantly improved operational lifetime and improved reliability. For example, the number of thermal cycles to failure may increase from around 400 or 500, expected of a typical leadless chip carrier, to greater than 1000 cycles by using a leadless chip carrier having a combination of a non-collapsible conductive shim bonded to its thermal pad and additional volume of solder (with or without a non-collapsible element) on the lead frame pads. Preferably the number of thermal cycles to failure is increased to greater than 1500 or greater than 2000.

A leadless chip carrier according to any embodiment described herein may be termed a bottom termination component (BTC). A BTC is a leadless packaging component that attaches directly to a PCB via connections defined on a bottom of the component. Although the connections are described as being on the bottom of a package, the leadless chip carrier may be assembled in any orientation in contact with a PCB. In other words the bottom of the package is defined as the portion that couples to a PCB. A leadless chip carrier for use in any embodiment may be selected from the list of package types including quad flat no lead (QFN) package, small outline no lead (SON) package, microlead frame (MLF) or microlead package (MLP), dual flat no lead (DFN) package, land grid array (LGA) package and lead frame chip scale package (LF-CSP). There may be many other terms that describe leadless chip carriers suitable for use in the present invention.

A method may be provided of modifying a leadless chip carrier for subsequent attachment to a printed circuit board (PCB) with a predetermined stand-off distance. The method may comprise the steps of; obtaining a leadless chip carrier comprising a thermal pad and a plurality of electrical lead frame pads for coupling to a printed circuit board (PCB), and bonding a non-collapsible conductive shim to the thermal pad, the conductive shim being between 50 microns and 1000 microns in thickness for providing the stand-off. The leadless chip carrier is further modified by the attachment of a volume of solder to each of the plurality of electrical lead frame pads.

The volume of solder may itself encapsulate a non-collapsible ball having a diameter approximately equal to the overall thickness achieved by the shim and the solder used to attach the shim to the thermal pad on the leadless chip carrier, plus or minus 10%. Rather than a non-collapsible ball, each volume of solder may bond a shaped preform to the plurality of electrical lead frame pads, each preform having a thickness that is approximately equal to the overall thickness achieved by the shim and the solder used to attach the shim to the thermal pad on the leadless chip carrier.

It is preferred that the conductive shim is bonded to the thermal pad of the leadless chip carrier by solder. In preferred examples, the conductive shim may have a first surface and a second surface, and at least one of the first surface and the second surface is coated with a layer of solder to enable bonding to the thermal pad and/or to the PCB. Thus, the conductive shim may be a substantially planar component having a first surface and a second surface, at least of the first surface and second surface being coated, encapsulated or clad with a layer of solder, for example a layer of solder between 10 and 30 microns in thickness.

Preferably the conductive shim is bonded to the thermal pad of the leadless chip carrier by a process of vacuum soldering. Such a process advantageously allows the voiding in the bond between the conductive shim and the thermal pad to be minimised.

The method of modifying a leadless chip carrier may form a leadless chip carrier according to any example or embodiment described herein, for example any leadless chip carrier described above or defined in the claims.

BRIEF DESCRIPTION OF THE DRAWINGS

Specific embodiments of the invention will now be described with reference to the figures, in which.

DETAILED DESCRIPTION

Figure 1:
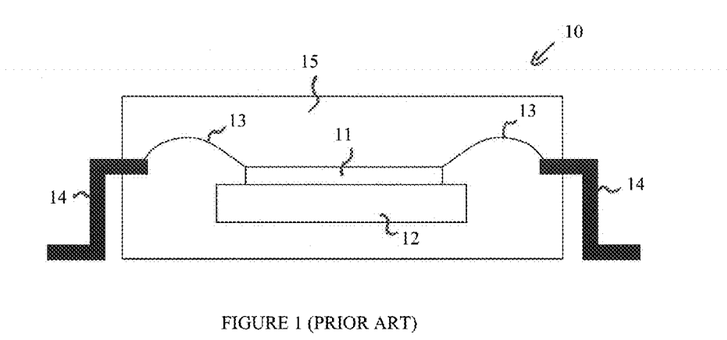
FIG. 1 is a schematic cross-sectional diagram of a typical leaded chip carrier.

FIG. 1 is a schematic cross-sectional diagram of a typical prior art leaded chip carrier, for example a leaded quad flat package (QFP). The leaded chip carrier 10 comprises an integrated circuit 11 mounted on a thermal pad 12. The thermal pad may be, alternatively, termed a die pad. The integrated circuit 11 is connected by electrical connections 13 to wire leads 14 for connecting the leaded chip carrier to a printed circuit board. The components of the leaded chip carrier, apart from terminal ends of the leads 14, are encapsulated in a polymeric resin casing 15 to form the package.

Leaded chip carriers such as that illustrated in FIG. 1 are a standard package type for mounting integrated circuits onto a PCB. As described above, the presence of leads that extend beyond the package casing means that care must be taken in handling the leaded chip carriers, and care must be taken in aligning the contacts 14 with matching contacts on a PCB.

Figure 2:
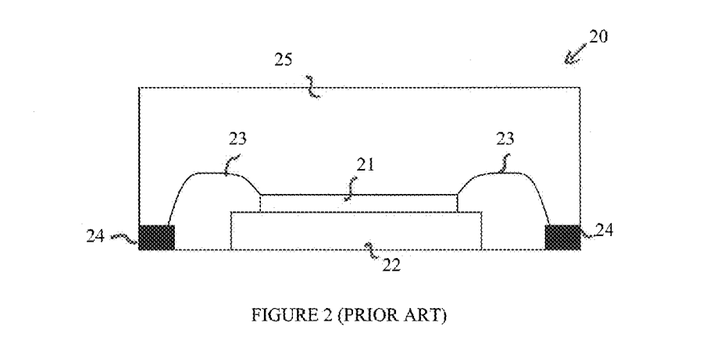
FIG. 2 is a schematic cross-sectional diagram of a typical leadless chip carrier having an exposed thermal pad.

Problems associated with handling and bending of leads on a leaded chip carrier, and with other issues such as excessive lead-wire inductance and poor thermal/electrical connectivity, may be addressed by the use of a leadless chip carrier. FIG. 2 is a schematic cross-sectional illustration of a typical leadless chip carrier 20. The leadless chip carrier 20 comprises an integrated circuit 21 mounted on a thermal pad 22 and coupled via electrical connections 23 to a plurality of electrical lead frame pads 24. The components of the leadless chip carrier are encapsulated in a polymeric resin casing 25 such that a surface of each of the electrical contacts 24 is exposed for connection to corresponding electrical contacts on a PCB. In the leadless chip carrier illustrated in FIG. 2 a lower surface of the thermal pad 22 or die pad is also exposed. The thermal pad may serve as a ground plane for the integrated circuit 21 or as a heat sink for transferring heat generated by the integrated circuit 21 away from the package.

Figure 3:
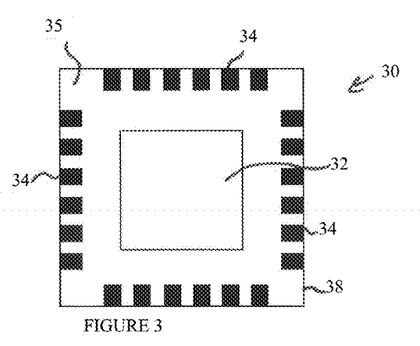
FIG. 3 is a bottom plan view of a typical leadless chip carrier having a thermal pad and electrical contacts arranged on four sides of the chip carrier package.
Figure 4:
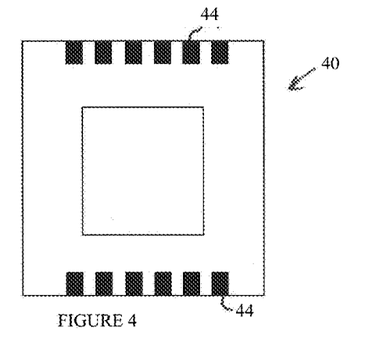
FIG. 4 is a bottom plan view of a typical leadless chip carrier having a thermal pad and electric contacts, in which the electrical contacts are arranged on two sides of the chip carrier package.
Figure 5:
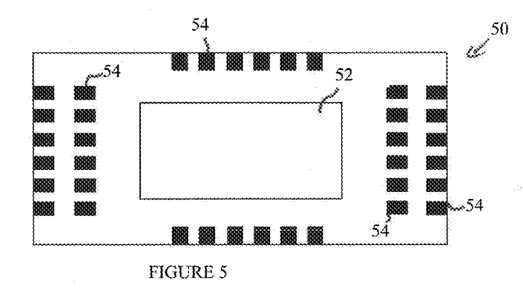
FIG. 5 is a bottom plan view of a chip carrier having a thermal pad and electrical contacts showing a further possible arrangement of electrical contacts.

FIGS. 3, 4 and 5 illustrate schematic bottom plan views of leadless chip carriers having an exposed thermal pad. Thus, FIG. 3 may be a bottom plan view of a typical quad flat no leads (QFN) package. This leadless chip carrier or package 30 has a bottom surface 38 defined by a resin casing 35 that encapsulates an integrated circuit. A central thermal pad 32 is exposed on the bottom of the package 30. A plurality of electrical contacts 34 are arranged along four sides of the QFN and exposed so that they may be coupled to corresponding contacts on a PCB.

FIG. 4 is a schematic bottom plan of a dual flat no leads (DFN) package. This chip carrier 40 is similar to the QFN package 30 illustrated in FIG. 3 but differs in having only two rows of electrical contacts 44.

FIG. 5 is a bottom plan illustration of a further leadless chip carrier 50 as with the chip carriers illustrated in FIGS. 3 and 4, the leadless chip carrier 50 of FIG. 5 has an exposed thermal pad 52 and a plurality of electrical contacts 54.

It is clear that a large number of configurations may be provided for leadless chip carriers and is not limited to the thermal pad being central to the component body. Furthermore, electrical lead frame pads can be arranged in a variety of patterns and/or layouts.

The leadless chip carriers illustrated in FIGS. 2 to 5 are typically attached to a PCB by means of a low profile solder joint. The electrical contacts of the leadless chip carrier align with electrical contacts on the PCB. The exposed thermal pad aligns with grounding and/or thermally conducting elements on the PCB and also serves as an attachment point. Problems may arise, however, due to differences in the coefficient of thermal expansion between the chip carrier and the PCB. Thermal cycling produces strains in the joint between the chip carrier and the PCB and the fluctuating stresses that occur with fluctuating thermal cycles result in fatigue of the joint. In leaded chip carriers, such as the leaded chip carrier illustrated in FIG. 1, strains may be accommodated by the attachment leads. Thus, leaded chip carriers are typically able to withstand more than 3000 thermal cycles before the joint between the chip carrier and the PCB is compromised. By contrast, typical leadless chip carriers may only last for 400 to 800 thermal cycles. The relatively low reliability of leadless chip carriers means that such packages are not generally adopted where reliability and lifetime of the joint are of importance.

Figure 6:
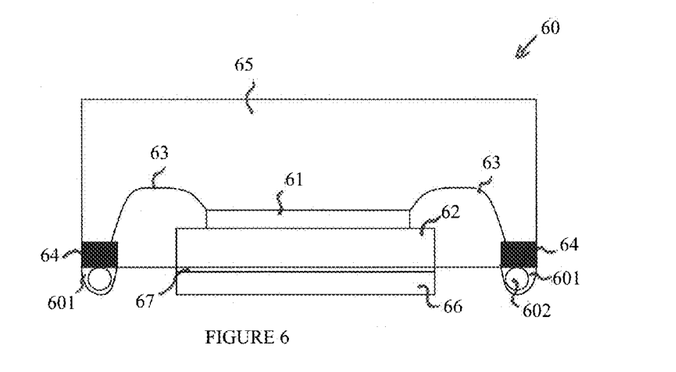
FIG. 6 is a schematic cross-sectional illustration of a leadless chip carrier according to an embodiment of the invention.

FIG. 6 is a schematic cross-sectional illustration of a leadless chip carrier 60 according to a specific embodiment of the invention. The leadless chip carrier comprises an integrated circuit 61 mounted on a thermal pad or die pad 62. The integrated circuit 61 is electrically connected to a plurality of electrical contacts 64 by electrical connections 63. The electrical connections 63, integrated circuit 61, thermal pad 62, and electrical contacts 64, are mounted or encapsulated within a resin casing 65. The electrical lead frame pads 64 and the thermal pad 62 are electrically and thermally conductive components formed from a copper alloy. A non-collapsible conductive shim 66 is bonded via a solder layer 67 to a lower surface of the thermal pad 62. The conductive shim is formed from a copper alloy. A volume of solder 601 is attached to a lower surface of each of the plurality of lead frame pads 64. Each volume of solder 61 encapsulates a non-collapsible conductive ball 602. The conductive ball 602 is formed from a copper alloy.

Thus, the leadless chip carrier 60 of FIG. 6 comprises a thermal pad 62 that is effectively extended by a non-collapsible conductive shim 66 bonded to a lower surface of the thermal pad 62 by the solder layer 67. Each of the plurality of electric contacts 64 is effectively extended by means of the non-collapsible conductive ball 602 and the volume of solder 601 attached to a lower surface of each of the plurality of electric contacts 64. Thus, when the leadless chip carrier 60 of FIG. 6 is attached to a PCB there is a stand-off between electrical contacts of the PCB and the thermal pad 62 or the leadless chip carrier 60.

Figure 7:
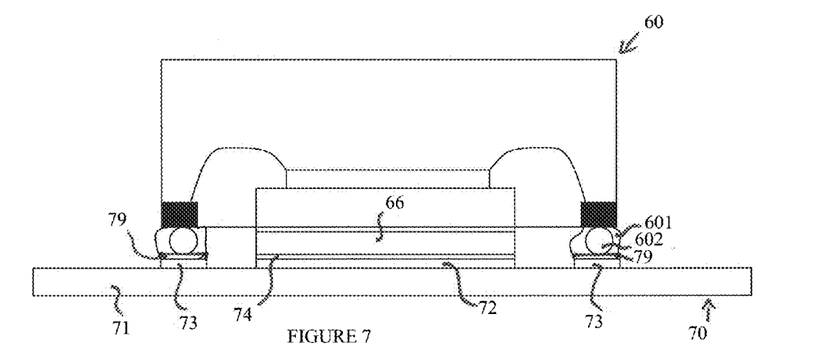
FIG. 7 is a schematic cross-sectional illustration of the leadless chip carrier of FIG. 6 when bonded to a PCB.

FIG. 7 is a schematic illustration showing the leadless chip carrier of FIG. 60 when attached to a PCB 70.

The PCB 70 comprises a board 71 having first contact pad 72 for attachment to a thermal pad of a leadless chip carrier, and a plurality of electrical contact pads 73, each of the electrical contact pads 73 for attachment to a lead frame pad of a leadless chip carrier.

The conductive shim 66 of the leadless chip carrier 60 is attached to the first contact pad 72 of the PCB 70 by means of a layer of solder 74. Each of the plurality of electrical contacts 64 of the leadless chip carrier 60 is attached to a corresponding electrical contact pad 73 of the PCB 70 through the volume of solder 601 and the non-collapsible conductive ball 602 by means of a layer of solder 79. The non-collapsible conductive shim 66 and the non-collapsible conductive ball 602 ensure a stand-off between the leadless chip carrier 60 and the PCB 70. The dimensions of the balls and the shim ensure a consistent stand-off over the area of contact between the leadless chip carrier and the PCB and further ensure that risk of tipping of the package. is significantly reduced.

Figure 8:
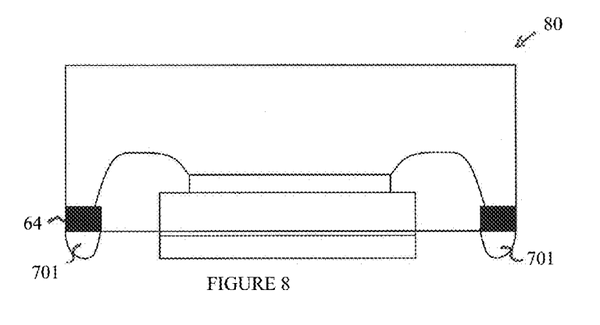
FIG. 8 is a schematic cross-sectional illustration of a leadless chip carrier according to a further specific embodiment of the invention.

FIG. 8 illustrates an alternative embodiment of a leadless chip carrier 80 according to a specific embodiment of the invention. The leadless chip carrier 80 of FIG. 8 is the same as the leadless chip carrier 60 of FIG. 6 with the difference that the peripheral lead frame pads 64 are each attached to a volume of solder 701 that does not encapsulate a non-collapsible ball. In embodiments where the conductive bottom pad is of sufficiently large area there may be no need for non-collapsible balls to be associated with each lead frame pad.

Figure 9:
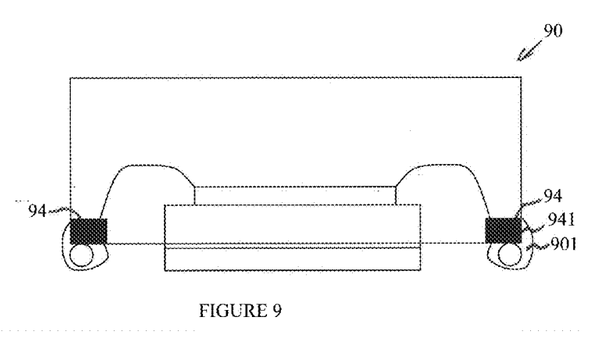
FIG. 9 is a schematic cross-sectional illustration of a further specific embodiment of a leadless chip carrier according to the invention.

FIG. 9 illustrates a further specific embodiment of a leadless chip carrier 90. The leadless chip carrier 90 of FIG. 9 is similar to the leadless chip carrier 60 of FIG. 6 with the difference that a plurality of electrical lead frame pads 94 have exposed surfaces at both a lower surface and a side surface of the chip carrier 90. Flanks 941 of the lead frame pads 94 are wetted with a volume of solder 901.

Figure 10:
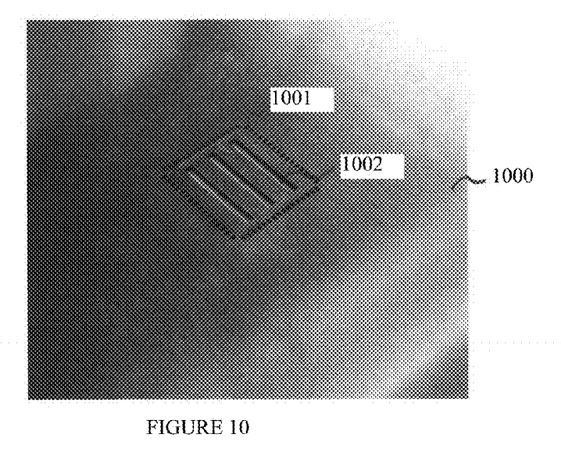
FIG. 10 illustrates a pasting stencil component used in a process for forming a leadless chip carrier according to an embodiment of the invention.
Figure 11:
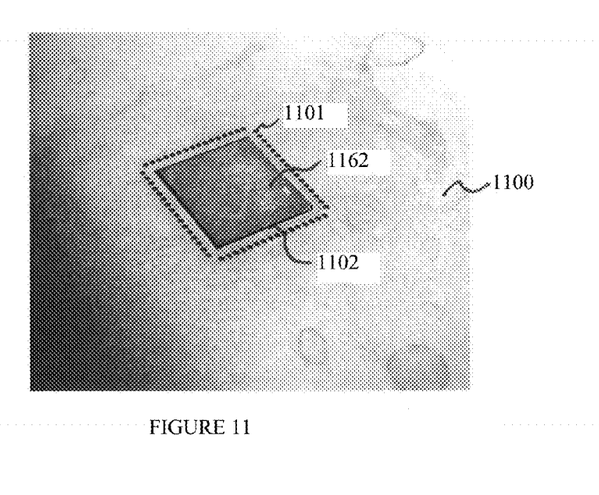
FIG. 11 is a balling stencil used for forming a leadless chip carrier according to an embodiment of the invention.

A process for making a leadless chip carrier as described herein will now be described with reference to FIGS. 10, 11 and 12. The method may be described as a method of modifying a leadless chip carrier.

The following method describes a process of modifying a quad flat no leads (QFN) package to produce a leadless chip carrier as, for example, described above in relation to FIG. 6. An unmodified QFN package is provided, the QFN package having a plan section that is essentially square having dimensions of 14 mm by 14 mm. The QFN comprises an exposed thermal pad having dimensions of 10 mm by 10 mm. Peripheral lead frame pads are arranged along each of the four sides of the bottom surface.

A pasting stencil 1000 is arranged over the bottom surface of the QFN to provide solder paste to the central thermal pad and to each of the plurality of lead frame pads. Solder paste is applied through the stencil and the stencil is removed. The stencil 1000 comprises a sheet of material having a hole 1001 defined for each of the peripheral lead frame pads of the QFN and three holes 1002 defined for the central thermal pad of the QFN. Paste that is applied through the stencil adheres to the relevant pads of the QFN.

After the stencil pad 1000 is removed, leaving solder paste in appropriate positions, a balling stencil 1100 is located over the QFN. The balling stencil 1100 comprises a plurality of apertures 1101 for receiving non-collapsible balls and a central aperture 1102 for receiving a conductive shim 1166. FIG. 11 shows a balling stencil with a conductive shim 1162 located within the central aperture 1102. The conductive shim 1162 is a shim formed from copper having dimensions of 9.9 mm by 9.9 mm and 160 micron thickness and cladded with 20 microns of solder on each side.

Once a conductive shim 1162 and a plurality of non-collapsible balls have been applied to the QFN using the ball stencil, the component undergoes reflow, under vacuum, to attach the conductive shim and the plurality of copper balls to the QFN to form the leadless chip carrier of the invention.

Figure 12:
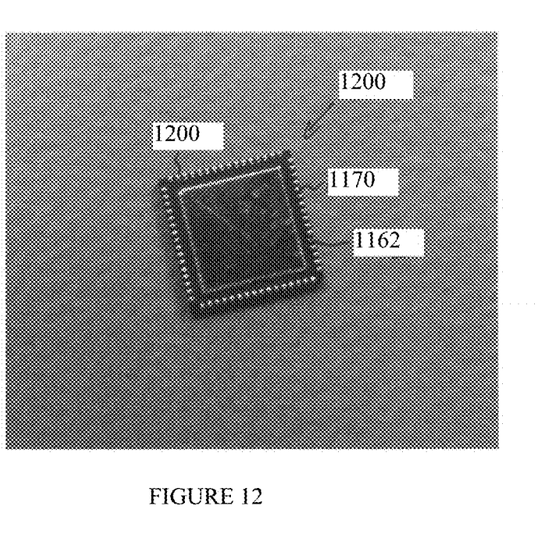
FIG. 12 illustrates a leadless chip carrier according to an embodiment of the invention.

FIG. 12 illustrates a leadless chip carrier 1200 according to the invention. The leadless chip carrier 1200 is a quad flat no leads package having a central thermal pad to which a conductive shim 1162 has been bonded by means of a solder paste. Each of the plurality of lead frame pads 1170 has a volume of tin lead solder (Sn63Pb37) and a non-collapsible copper ball attached.

The invention claimed is:

1. A leadless chip carrier comprising a thermal pad for attaching to a printed circuit board (PCB), and an integrated circuit electrically connected to a plurality of electrical lead frame pads for connection to a plurality of corresponding pads on the PCB, in which the leadless chip carrier further comprises a non-collapsible conductive shim bonded to a first surface of the thermal pad, the conductive shim having a first surface and a second surface, the first surface of the conductive shim being bonded to the first surface of the thermal pad by a layer of a solder having a thickness of between 10 and 150 microns in thickness, the conductive shim being between 100 microns and 1000 microns in thickness for providing a stand-off between the thermal pad and the PCB, and in which each of the plurality of electrical lead frame pads is attached to a volume of solder.

2. The leadless chip carrier of claim 1 in which the integrated circuit is mounted in electrical communication with the thermal pad and the thermal pad acts as a ground plane for the integrated circuit.

3. The leadless chip carrier of claim 1 in which the integrated circuit is mounted in thermal communication with the thermal pad and the thermal pad acts as a heat sink for the integrated circuit.

4. The leadless chip carrier of claim 1 in which the conductive shim covers at least 80% of the first surface of the thermal pad, preferably at least 90%, preferably at least 95% of the first surface of the thermal pad.

5. The leadless chip carrier of claim 4 in which the conductive shim covers substantially all of the first surface of the thermal pad.

6. The leadless chip carrier of claim 1 in which the bond between the conductive shim and the thermal pad has a voidage of less than 30%, preferably less than 10%, preferably less than 7.5%, preferably lower than 5%.

7. The leadless chip carrier of claim 1 in which each of the electrical lead frame pads is attached to a volume of solder of approximately the same thickness as the overall thickness achieved by the conductive shim and the solder used to attach the conductive shim to the thermal pad on the leadless chip carrier, plus or minus about 10%.

8. The leadless chip carrier of claim 1 in which
each volume of solder locates or encapsulates
a non-collapsible ball having a diameter approximately equal to the overall thickness achieved by
the conductive shim and the solder used to attach the conductive shim to the thermal pad on the leadless chip carrier, plus or minus about 10% or
a non-collapsible preform having a thickness approximately equal to the overall thickness achieved by the conductive shim and the solder used to attach the conductive shim to the thermal pad on the leadless chip carrier, plus or minus about 10%.

9. The leadless chip carrier of claim 8 in which the non-collapsible balls or the non-collapsible preforms are conductive, preferably metallic.

10. The leadless chip carrier of claim 9 in which the non-collapsible conductive balls or the non-collapsible preforms are formed from a material from the list consisting of a metal, a metallic alloy, and a non-metallic conductive material, preferably from copper or a copper alloy or a conductive ceramic or carbon.

11. The leadless chip carrier of claim 1 in which the second surface of the conductive shim is coated with a layer of solder for bonding to a PCB of between 10 and 150 microns in thickness, and preferably between 10 microns and 30 microns in thickness.

12. The leadless chip carrier of claim 1 in which the conductive shim is formed from a material from the list consisting of a metal, a metallic alloy, and a non-metallic conductive material, preferably from copper or a copper alloy or a conductive ceramic or carbon.

\* \* \* \* \*